United States Patent
Li et al.

(10) Patent No.: US 10,203,356 B2
(45) Date of Patent: Feb. 12, 2019

(54) PORTABLE MEASUREMENT DEVICE

(71) Applicant: Fluke Corporation, Everett, WA (US)

(72) Inventors: Fang Li, Shanghai (CN); Wei Huang, Shanghai (CN); Shounan Luo, Shanghai (CN)

(73) Assignee: Fluke Corporation, Everett, WA (US)

( * ) Notice: Subject to any disclaimer, the term of this patent is extended or adjusted under 35 U.S.C. 154(b) by 5 days.

(21) Appl. No.: 15/256,190

(22) Filed: Sep. 2, 2016

(65) Prior Publication Data

US 2017/0059626 A1    Mar. 2, 2017

(30) Foreign Application Priority Data

Sep. 2, 2015 (CN) ...................... 2015 2 0677873 U

(51) Int. Cl.
| | |
|---|---|
| *G01R 15/18* | (2006.01) |
| *G01R 1/22* | (2006.01) |
| *G01R 19/00* | (2006.01) |
| *G01R 1/067* | (2006.01) |

(52) U.S. Cl.
CPC ............ *G01R 15/181* (2013.01); *G01R 1/22* (2013.01); *G01R 15/186* (2013.01); *G01R 19/0092* (2013.01); *G01R 1/06788* (2013.01)

(58) Field of Classification Search
CPC ............ G01R 31/2894; G01R 31/2853; G11C 29/022; G11C 29/816
USPC .................................... 324/71.11, 73.1, 76.11
See application file for complete search history.

(56) References Cited

U.S. PATENT DOCUMENTS

| | | | |
|---|---|---|---|
| 6,617,972 B2 * | 9/2003 | Takarada | ........... G08B 21/0484 |
| | | | 324/538 |
| 8,779,729 B2 * | 7/2014 | Shiraishi | ............ G01R 31/3606 |
| | | | 320/134 |
| 2007/0252578 A1 | 11/2007 | Luo et al. | |

(Continued)

FOREIGN PATENT DOCUMENTS

| | | |
|---|---|---|
| EP | 1 566 641 A1 | 8/2005 |
| FR | 2 538 556 A1 | 6/1984 |
| GB | 2 291 273 A | 1/1976 |

OTHER PUBLICATIONS

European Search Report, dated Feb. 8, 2017, for European Application No. 16186889.8-1568 / 3139184, 9 pages.

*Primary Examiner* — Giovanni Astacio-Oquendo
(74) *Attorney, Agent, or Firm* — Seed Intellectual Property Law Group LLP

(57) ABSTRACT

A portable measurement device includes an elongated body, a stationary portion fixedly mounted to a distal end, and a movable jaw movably mounted to the distal end and movable between a closed position and an open position. In the closed position, the movable jaw and the stationary portion form a closed loop with an inner diameter of less than or equal to 10 mm. Alternatively, at least one of the movable jaw and the stationary portion has a cross-sectional diameter of less than or equal to 5 mm. In the open position, the movable jaw and the stationary portion define a gap allowing a wire under test to pass therethrough into the loop. A switch drives the movable jaw between the closed and open positions. A measurement circuit electrically coupled to the stationary portion and the movable jaw to receive and measure a sensing current generated by the closed loop.

33 Claims, 2 Drawing Sheets

(56) References Cited

U.S. PATENT DOCUMENTS

| | | | |
|---|---|---|---|
| 2012/0098518 A1* | 4/2012 | Unagami | G01R 22/066 |
| | | | 324/74 |
| 2013/0032983 A1 | 2/2013 | Liu | |
| 2017/0060150 A1* | 3/2017 | Stefanski | G05D 23/27 |
| 2018/0036740 A1* | 2/2018 | Nelson | B02C 19/18 |
| 2018/0059176 A1* | 3/2018 | Ding | G01R 1/0433 |

* cited by examiner

PORTABLE MEASUREMENT DEVICE

TECHNICAL FIELD

The present application relates to electronic measurement technology and, in particular, to a portable measurement device.

BACKGROUND

Various measurement devices, which are used for measuring electrical parameters (such as voltage, current and impedance), are widely used in industrial production and daily life. A clamp meter, which is a typical current measurement device, is capable of detecting an alternating current in an electrical cable or wire without powering off a circuit.

With regard to some complicated electronic control systems, electrical wires are often used for coupling various devices and modules together. Many of these wires are fixed into a bundle, which results in narrow gaps between the wires. When conventional clamp meters are used to measure the bundled wires, it's generally difficult to pick out one or more wires under test from the bundled wires for measurement, as these clamp meters may have relatively large clamp arms.

Therefore, there is a need to provide a measurement device which is convenient to pick out and clamp wires and measure them.

SUMMARY

An objective of the present application is to provide a measurement device which is convenient to pick out and clamp wires and measure them.

According to an aspect of the present application, a portable measurement device is provided, comprising an elongated body with a distal end and a proximal end; a stationary portion fixedly mounted to the distal end, and a movable jaw movably mounted to the distal end and movable between a closed position and an open position. In the closed position, the movable jaw and the stationary portion form a closed loop with an inner diameter of less than or equal to 10 mm, wherein the closed loop can generate a sensing current. In the open position, the movable jaw and the stationary portion define a gap allowing a wire under test to pass therethrough between the movable jaw and the stationary portion into the loop. The portable measurement device further comprises a switch for driving the movable jaw to move between the closed position and the open position, and a measurement circuit disposed within the elongated body and electrically coupled to the stationary portion and the movable jaw to receive and measure the sensing current.

The inner diameter of the closed loop used for sensing electric currents in the aforesaid portable measurement device is much smaller than that of a conventional clamp meter. Therefore, when gaps between wires are small, an operator can still pick out and measure a wire under test from a plurality of wires conveniently.

In some embodiments, the movable jaw is slidable along a lengthwise direction of the elongated body to move between the open position and the closed position.

In some embodiments, the switch comprises a biasing element for exerting a biasing force to the movable jaw to move the movable jaw from the open position to the closed position.

In some embodiments, the elongated body is of a pen shape.

In some embodiments, the movable jaw is of a semicircular shape.

In some embodiments, the movable jaw has a hook-shaped free end bending towards the elongated body.

In some embodiments, the stationary portion has at its distal end an extension arm which forms a portion of the closed loop.

In some embodiments, a gap can be formed between the extension arm and the movable jaw to allow the wire under test to pass therethrough into the closed loop.

In some embodiments, the extension arm is movable relative to the movable jaw for opening or closing the closed loop.

In some embodiments, the stationary portion comprises a first non-magnetic core, a first inductance coil wound around the non-magnetic core, and a first housing enclosing the first inductance coil.

In some embodiments, the first inductance coil has a cross-sectional diameter of less than or equal to 3 mm.

In some embodiments, the movable jaw comprises: a second non-magnetic core; a second inductance coil wound around the second non-magnetic core; and a second housing enclosing the second stationary inductance coil and of a tubular shape.

In some embodiments, the second inductance coil has a diameter of less than or equal to 3 mm.

In some embodiments, at least a portion of the second housing is integrally formed with the elongated body.

In some embodiments, each of the movable jaw and the stationary portion has a cross-sectional diameter of less than or equal to 5 mm.

In some embodiments, the elongated body has at its distal end a cylindrical rod to which the stationary portion and the movable jaw are mounted.

In some embodiments, the portable measurement device is a clamp meter.

According to another aspect of the present application, a portable measurement device is provided, comprising an elongated body with a distal end and a proximal end, a stationary portion fixedly mounted to the distal end, and a movable jaw movably mounted to the distal end and movable between a closed position and an open position. In the closed position, the movable jaw and the stationary portion form a closed loop for generating a sensing current. In the open position, the movable jaw and the stationary portion define a gap allowing a wire under test to pass therethrough between the movable jaw and the stationary portion into the loop. At least one of the movable jaw and the stationary portion has a cross-sectional diameter of less than or equal to 5 mm. The portable measurement device further comprises a switch for driving the movable jaw to move between the closed position and the open position, and a measurement circuit disposed within the elongated body and electrically coupled to the stationary portion and the movable jaw to receive and measure the sensing current.

The cross-sectional diameter of the movable jaw or the stationary portion of the aforesaid portable measurement device is much smaller than that of a jaw of a conventional clamp meter. Thus, the closed looped formed by the movable jaw and the stationary portion for detecting a sensing current can have a relatively small size. In this way, when the gaps between wires are small, an operator can still pick out and measure a wire under test from a plurality of wires conveniently.

In some embodiments, the movable jaw is slidable along a lengthwise direction of the elongated body to move between the open position and the closed position.

In some embodiments, the switch comprises a biasing element for exerting a biasing force to the movable jaw to move the movable jaw from the open position to the closed position.

In some embodiments, the movable jaw has a hook-shaped free end bending towards the elongated body.

The foregoing has outlined, rather broadly, features of the present application. Additional features of the present application will be described hereinafter. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE DRAWINGS

The aforementioned features and other features of the present application will be fully understood by reading the following description by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE EMBODIMENTS

The following detailed description refers to the accompanying drawings which are a part of the present application. The illustrative embodiments described in the detailed description, the accompanying drawings and the claims are not limiting, and other embodiments may be adopted, or modifications may be made without deviating from the spirit and subject of the present application. It should be understood that the various aspects of the present application described and graphically presented herein may be arranged, replaced, combined, divided and designed in many different configurations, and these different configurations are implicitly comprised in the present application.

Figure 1:
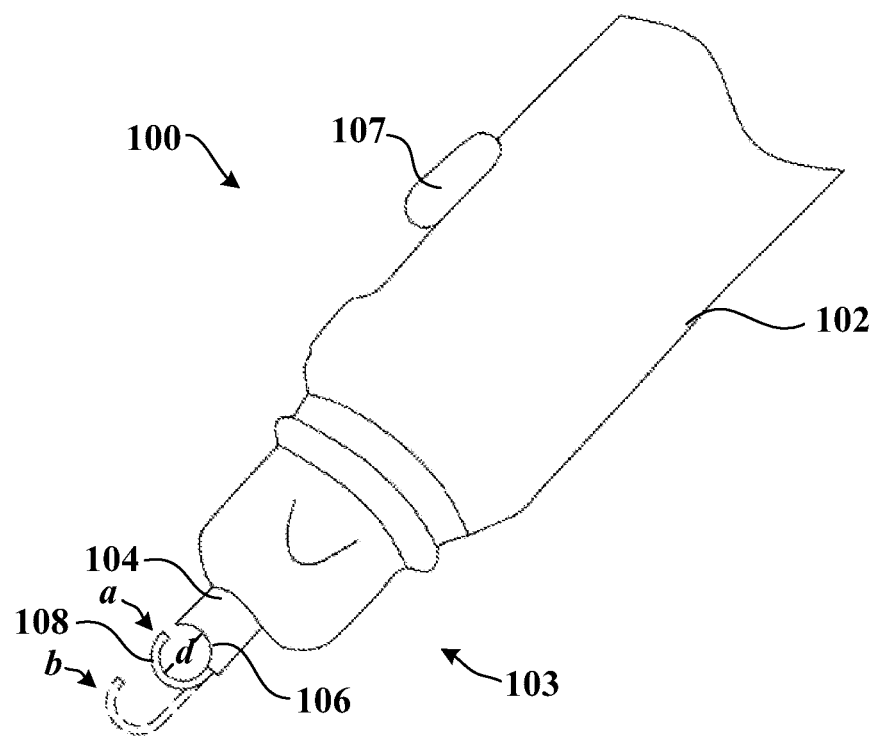
FIG. 1 is a diagram of a portable measurement device according to an embodiment of the present application.

FIG. 1 illustrates a portable measurement device 100 according to an embodiment of the present application. In some embodiments, the portable measurement device 100 could be a clamp meter that is used for measuring an electric current flowing in an electrical wire.

As illustrated in FIG. 1, the portable measurement device 100 has an elongated body 102 with a distal end 103 and a proximal end (not shown). The proximal end and the distal end 103 are two ends of the elongated body 102 along its lengthwise direction. In the present application, the proximal end is an end of the portable measurement device 100 which is relatively close to an operator, while the distal end is the other end which is relatively far away from the operator. During the operation of the measurement device 100, the distal end 103 of the elongated body 102 is closer to the wire under test compared with the proximal end.

In some embodiments, the elongated body 102 can be of a pen shape, such as a conical shape, a cylindrical shape, a multi-prismatic shape, or a combination thereof. A pen-shaped structure is convenient for an operator to hold, and its orientation can be easily adjusted for aiming at the wire under test. In some embodiments, the elongated body 102 may have one or more recesses, grooves, or protrusions at its outer wall. By way of example, an area adjacent to the distal end 103 of the elongated body 102 can have threads or recesses that facilitate fingers to hold the elongated body 102. By way of another example, an exterior of the elongated body 102 can have sleeves or rings of an elastic material, e.g. rubber, such that the operator can hold the elongated body 102 firmly, thereby preventing the elongated body 102 from slipping off his/her hand.

The elongated body 102 has a housing that defines an exterior profile and an interior space of the elongated body 102. The interior space of the elongated body 102 is mainly used for receiving electric components of the portable measurement device 100, such as a measurement circuit (not shown) and/or a power supply. In some embodiments, the housing of the elongated body 102 includes a proximal portion and a distal portion that are removably connected with each other. For example, the proximal portion and the distal portion can be threadedly connected together.

In some embodiments, the elongated body 102 may have a cylindrical rod 104, which is disposed at the distal end 103 of the elongated body 102. The cylindrical rod 104 has a relatively small diameter compared with a body portion of the elongated body 102.

In some embodiments, the portable measurement device 100 further includes a stationary portion 106 fixedly mounted to the distal end 103, and a movable jaw 108 movably mounted to the distal end 103. In the embodiment illustrated in FIG. 1, the stationary portion 106 is integrally formed with the cylindrical rod 104, and the movable jaw 108 is movably connected to the cylindrical rod 104 and thus can move relative to the stationary portion 106. In some embodiments, the movable jaw 108 is slidable along the lengthwise direction of the elongated body 102 between a closed position a and an open position b. In the closed position a, the movable jaw 108 is close to the stationary portion 106, and the two ends of the two components abut against each other or move sufficiently close to each other to have a relatively small distance therebetween, thereby forming a closed loop which can measure an electric current. In the open position b, the movable jaw 108 is far away from the stationary portion 106, and the two ends of the movable jaw 108 and the stationary portion 106 form a gap. In some embodiments, the movable jaw 108 is rotatable within a virtual plane where the closed loop resides, such that a portion of the movable jaw 108 can rotate to a position far away from the stationary portion 106 and form a gap therebetween.

Figure 2A:
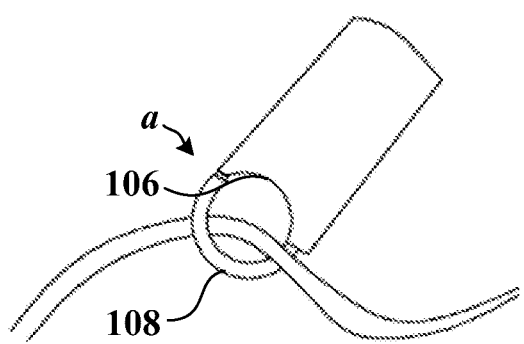
FIGS. 2A and 2B are two partial views of the portable measurement device of FIG. 1 when a wire under test is being picked out and is clamped by the portable measurement device, respectively.
Figure 2B:
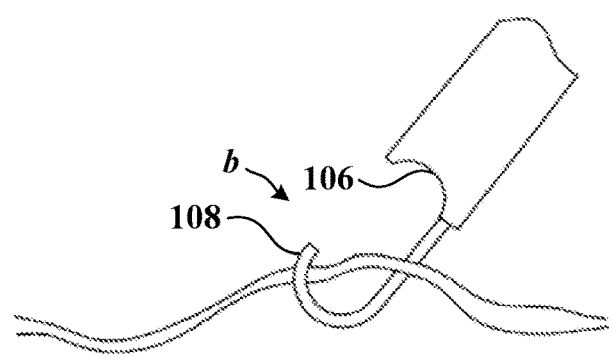

FIGS. 2A and 2B are two partial views of the portable measurement device of FIG. 1 when a wire under test is being picked out and is clamped by the portable measurement device, respectively. Referring to FIGS. 1 and 2A-2B, the movable jaw 108 is movable between the closed position a and the open position b. In some embodiments, in the closed position a, the gap (i.e. an air gap) between the movable jaw 108 and an end of the stationary portion 106 is equal to or less than a predetermined distance, such that an inductance coil(s) within the movable jaw 108 and the stationary portion 106 can generate a sensing current from an electric current flowing within a wire under test proportionally. In some embodiments, the movable jaw 108 can engage with the stationary portion 106 at their respective ends. The movable jaw 108 and the stationary portion 106 can form a closed loop with an inner diameter d of less than or equal to 10 mm, such as less than or equal to 9 mm, 8 mm, 7 mm, 6 mm or 5 mm. Each of the movable jaw 108 and the stationary portion 106 has an inductance coil therein. In measurement, i.e. the movable jaw 108 is in the closed position a, the wire under test can pass through the closed loop formed by the stationary portion 106 and the movable jaw 108, such that the inductance coils in the closed loop can sense a change of the electric current flowing in the wire under test, and thus generate the sensing current. The movable jaw 108 can move away from the stationary portion 106 and to the open position b. In this way, the moveable jaw 108 and the stationary portion 106 may form a gap 110 therebetween, which allows the wire under test to pass therethrough into the loop between the movable jaw 108 and the stationary portion 106. In this embodiment, because of the small inner diameter of the closed loop formed by the movable jaw 108 and the stationary portion 106, the operator can easily pick out the wire under test from a plurality of wires for measurement even if the gaps between these wires are small.

In some embodiments, at least one of the movable jaw 108 and the stationary portion 106 has a cross-sectional diameter of equal to or less than 5 mm, such as equal to or less than 2 mm, 2.5 mm, 3 mm, 3.5 mm, 4.5 mm or 5 mm. Correspondingly, the closed loop formed by the movable jaw 108 and the stationary portion 106 may have a relatively small inner diameter. Therefore, in cases that the gaps between wires are small, the operator can still easily pick out the wire under test from a plurality of wires for measurement. In some embodiments, each of the movable jaw 108 and the stationary portion 106 has a cross-sectional diameter of less than or equal to 5 mm. In some other embodiments, the cross-sectional diameter of the movable jaw 108 is less than or equal to 5 mm, while the cross-sectional diameter of the stationary portion 106 is more than 5 mm. Alternatively, the cross-sectional diameter of the movable jaw 108 is more than 5 mm, while the cross-sectional diameter of the stationary portion 106 is less than or equal to 5 mm. It can be understood that, in the embodiment illustrated in FIG. 1, the stationary portion 106 is integrally formed with the cylindrical rod 104, and thus the cross-sectional diameter of at least a portion of the stationary portion 106 can be more than 5 mm.

As mentioned above, each of the stationary portion 106 and the movable jaw 108 has an inductance coil for sensing the change of the electric current in the wire under test. In some embodiments, the inductance coil can be a Rogowski coil. Correspondingly, the stationary portion 106 includes a first non-magnetic core, a first inductance coil wound around the first non-magnetic core, and a first housing enclosing the first inductance coil. In some embodiments, the first housing can be integrally formed with the housing of the cylindrical rod 104, or can be embedded within the cylindrical rod 104. The first non-magnetic core can be made of a non-ferromagnetic material, such as plastics. In some embodiments, the first inductance coil uniformly winds around the first non-magnetic core. A cross-sectional diameter of the first inductance coil can be less than or equal to 3 mm, such as less than or equal to 1 mm, 1.5 mm, 2 mm, 2.5 mm, or 3 mm. In the application, the cross-sectional diameter of the first inductance coil or other inductance coils refers to a diameter of a spiral of the inductance coil, rather than a cross-sectional diameter of a wire within the inductance coil. When the spirals of the inductance coil have different diameters, the cross-sectional diameter of the inductance coil can be an average value of the diameters of these spirals, or a minimum value of the diameters of all the spirals. Mated with the Rogowski coil, a measurement circuit of the measurement device can include an integration circuit that is configured to convert an output of the Rogowski coil to a voltage signal proportional to the electric current flowing in the wire under test.

The first housing enclosing the first inductance coil has a chamber for containing the first non-magnetic core and the first inductance coil. In some embodiments, the first housing is formed with a strength and thickness sufficient to protect the first inductance coil. For example, the first housing can have a thickness of 1 mm. At least a portion of the first housing can be integrally formed with the elongated body 102. In some embodiments, a top section of the stationary portion 106 has a semi-circular surface mating with the semi-circular movable jaw 108 to form the closed-ring structure.

In some embodiments, the movable jaw 108 can be semi-circular, as shown in FIGS. 1 and 2A-2B. The movable jaw 108 can have a hook-shaped free end bending towards the elongated body 102. In this way, when the wire under test is hooked by the movable jaw 108, it would not slip off during the movement of the movable jaw 108, thereby preventing repetitive operation of the operator.

Similar to the stationary portion 106, the movable jaw 108 includes a second non-magnetic core, a second inductance coil wound around the second non-magnetic core, and a second housing enclosing the second inductance coil. The second non-magnetic core can be made of a non-ferromagnetic material, such as plastics. In some embodiments, the second inductance coil uniformly winds around the second non-magnetic core, and has a cross-sectional diameter of less than 3 mm. In some embodiments, the movable jaw 108 is movably mounted at the cylindrical rod 104 of the elongated body 102. For example, the second housing can extend a length into the elongated body 102, and be mechanically coupled with a switch 107. In this way, when the movable jaw 108 is driven by the switch 107 to move between the closed position a and the open position b, the second inductance coil within the second housing would not be exposed.

In some embodiments, the switch 107 further includes a biasing element for exerting a biasing force to the movable jaw 108 to move it from the open position b to the closed position a. For example, the biasing element could be a spring. When the wire under test is hooked by the movable jaw 108, an operator can loosen the switch 107. In this way, the biasing force exerted by the biasing element permits the movable jaw 108 to retract to the closed position a automatically, thereby clamping the wire under test for measurement.

Figure 3:
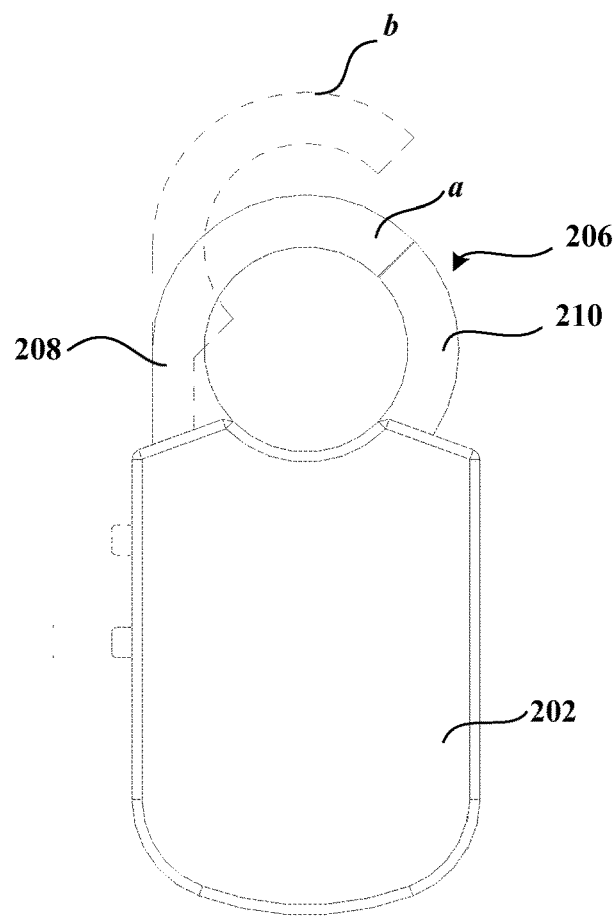
FIG. 3 is a structure of a distal end of a portable measurement device according to another embodiment of the present invention.

FIG. 3 illustrates a structure of a distal end of a portable measurement device according to another embodiment of the present application. In some embodiments, a stationary portion 206 and a movable jaw 208 are mounted at a distal end of an elongated body 202. The stationary portion 206 may be shaped similar to the movable jaw 208, e.g. both are of a semi-circular shape. In some embodiments, a portion of the semi-circular shape can be embedded in the elongated body 202, while an extension arm 210, which is the other portion located at the distal end of the semi-circular shape, may extend outward from the elongated body 202. The extension arm 210 is a portion of a closed loop formed by the stationary portion 206 and the movable jaw 208. In other words, the housings of the stationary portion 206 and the elongated body 202 are two elements that may be manufactured separately and then assembled together. A gap is formed between the extension arm 210 and the movable jaw 208 to allow a wire under test to pass through the gap and into the closed loop. The movable jaw 208 is movable relative to the extension arm 210. For example, the movable jaw 208 can be slidable along a lengthwise direction of the elongated body 202, so as to move between an open position b and a closed position a. In this way, the closed loop can be opened to let a wire under test in, or can be closed to capture the wire under test. In some embodiments, the extension arm 210 can be a portion of the stationary portion 206, and also the extension arm 210 is movable, e.g. along a clockwise direction so as to retract into the elongated body 202, or along a counterclockwise direction so as to extend out of the elongated body 202.

In some embodiments, the portable measurement device of the present application may further include a measurement circuit (not shown) disposed within the elongated body. The measurement circuit is electrically coupled to the stationary portion and the movable jaw to receive and measure a sensing current. In some embodiments, the measurement circuit may include a signal amplification module, an analog-to-digital conversion module, a control module and etc. In some embodiments, the signal amplification module is configured to amplify or adjust an amplitude of the sampled sensing current into a range desired by the analog-to-digital conversion module. The analog-to-digital conversion module is configured to convert the amplified signal into a digital signal, which is further provided to the control module. The control module can conduct a data process operation on the digital signal for obtaining a measurement result, and control notifying an operator of the measurement result. For example, a signal processing circuit can provide prompts of the measurement result in a visible or audible manner for the operator.

It should be noted that, although several modules or sub-modules of certain portable measurement devices are described in the detailed description above, such classification is merely exemplary rather than mandatory. In fact, according to the embodiments of the present application, features or functions of two or more modules described above can be embodied in a single module. On the contrary, features or functions of a module described above can be further embodied in several separate modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A portable measurement device, comprising:
   an elongated body with a distal end and a proximal end;
   a stationary portion fixedly mounted to the distal end, and
      a movable jaw movably mounted to the distal end and movable between a closed position and an open position, wherein in the closed position the movable jaw and the stationary portion form a closed loop with an inner diameter of less than or equal to 10 mm, wherein the closed loop can generate a sensing current, and in the open position the movable jaw and the stationary portion define a gap allowing a wire under test to pass therethrough between the movable jaw and the stationary portion into the loop;
   a switch for driving the movable jaw to move between the closed position and the open position; and
   a measurement circuit disposed within the elongated body and electrically coupled to the stationary portion and the movable jaw to receive and measure the sensing current.

2. The portable measurement device of claim 1, wherein the movable jaw is slidable along a lengthwise direction of the elongated body to move between the open position and the closed position.

3. The portable measurement device of claim 1, wherein the switch comprises a biasing element for exerting a biasing force to the movable jaw to move the movable jaw from the open position to the closed position.

4. The portable measurement device of claim 1, wherein the elongated body is of a pen shape.

5. The portable measurement device of claim 1, wherein the movable jaw is of a semi-circular shape.

6. The portable measurement device of claim 1, wherein the movable jaw has a hook-shaped free end bending towards the elongated body.

7. The portable measurement device of claim 1, wherein the stationary portion has at its distal end an extension arm which forms a portion of the closed loop.

8. The portable measurement device of claim 7, wherein a gap can be formed between the extension arm and the movable jaw to allow the wire under test passing therethrough and into the closed loop.

9. The portable measurement device of claim 7, wherein the extension arm is movable relative to the movable jaw for opening or closing the closed loop.

10. The portable measurement device of claim 1, wherein the stationary portion comprises:
    a first non-magnetic core;
    a first inductance coil wound around the non-magnetic core; and
    a first housing enclosing the first inductance coil.

11. The portable measurement device of claim 10, wherein the first inductance coil has a cross-sectional diameter of less than or equal to 3 mm.

12. The portable measurement device of claim 1, wherein the movable jaw comprises:
    a second non-magnetic core;
    a second inductance coil wound around the second non-magnetic core; and
    a second housing enclosing the second stationary inductance coil and of a tubular shape.

13. The portable measurement device of claim 12, wherein the second inductance coil has a diameter of less than or equal to 3 mm.

14. The portable measurement device of claim 12, wherein at least a portion of the second housing is integrally formed with the elongated body.

15. The portable measurement device of claim 1, wherein each of the movable jaw and the stationary portion has a cross-sectional diameter of less than or equal to 5 mm.

16. The portable measurement device of claim 1, wherein the elongated body has at its distal end a cylindrical rod to which the stationary portion and the movable jaw are mounted.

17. The portable measurement device of claim 1, wherein the portable measurement device is a clamp meter.

18. A portable measurement device, comprising:
an elongated body with a distal end and a proximal end;
a stationary portion fixedly mounted to the distal end, and
a movable jaw movably mounted to the distal end and movable between a closed position and an open position, wherein in the closed position the movable jaw and the stationary portion form a closed loop for generating a sensing current, and in the open position the movable jaw and the stationary portion define a gap allowing a wire under test to pass therethrough between the movable jaw and the stationary portion into the loop, wherein at least one of the movable jaw and the stationary portion has a cross-sectional diameter of less than or equal to 5 mm;
a switch for driving the movable jaw to move between the closed position and the open position; and
a measurement circuit disposed within the elongated body and electrically coupled to the stationary portion and the movable jaw to receive and measure the sensing current.

19. The portable measurement device of claim 18, wherein the movable jaw is slidable along a lengthwise direction of the elongated body to move between the open position and the closed position.

20. The portable measurement device of claim 18, wherein the switch comprises a biasing element for exerting a biasing force to the movable jaw to move the movable jaw from the open position to the closed position.

21. The portable measurement device of claim 18, wherein the movable jaw has a hook-shaped free end bending towards the elongated body.

22. A portable measurement device, comprising:
an elongated body with a distal end and a proximal end;
a stationary portion fixedly mounted to the distal end; and
a movable jaw of a semi-circular shape that is movably mounted to the distal end and slidable along a lengthwise direction of the elongated body to move between a closed position and an open position, wherein:
in the closed position, the movable jaw and the stationary portion form a closed loop that can generate a sensing current; and
in the open position, the movable jaw is slid in the lengthwise direction away from the elongated body, the movable jaw and the stationary portion defining a gap that allows a wire under test to pass therethrough into the loop between the movable jaw and the stationary portion,
the stationary portion having at its distal end an extension arm that forms a portion of the closed loop, wherein the extension arm is movable relative to the movable jaw for opening or closing the closed loop;
the portable measurement device further comprising:
a switch for driving the movable jaw to move between the closed position and the open position; and
a measurement circuit disposed within the elongated body and electrically coupled to the stationary portion and the movable jaw to receive and measure the sensing current.

23. The portable measurement device of claim 22, wherein in the closed position, the closed loop has an inner diameter of less than or equal to 10 mm.

24. The portable measurement device of claim 22, wherein the stationary portion comprises:
a first non-magnetic core;
a first inductance coil wound around the non-magnetic core; and
a first housing enclosing the first inductance coil.

25. The portable measurement device of claim 24, wherein the first inductance coil has a cross-sectional diameter of less than or equal to 3 mm.

26. The portable measurement device of claim 22, wherein the movable jaw comprises:
a second non-magnetic core;
a second inductance coil wound around the second non-magnetic core; and
a second housing enclosing the second stationary inductance coil and of a tubular shape.

27. The portable measurement device of claim 26, wherein the second inductance coil has a diameter of less than or equal to 3 mm.

28. The portable measurement device of claim 22, wherein at least one of the movable jaw and the stationary portion has a cross-sectional diameter of less than or equal to 5 mm.

29. The portable measurement device of claim 22, wherein the elongated body has at its distal end a cylindrical rod to which the stationary portion and the movable jaw are mounted.

30. The portable measurement device of claim 22, wherein each of the movable jaw and the stationary portion has a cross-sectional diameter of less than or equal to 5 mm.

31. The portable measurement device of claim 22, wherein the switch comprises a biasing element that exerts a biasing force to the movable jaw to move the movable jaw from the open position to the closed position.

32. The portable measurement device of claim 22, wherein the movable jaw has a hook-shaped free end that bends towards the elongated body.

33. The portable measurement device of claim 22, wherein the extension arm is movable in a first direction so as to retract into the elongated body, or along a second direction so as to extend out of the elongated body.

* * * * *